United States Patent [19]
Komvopoulos et al.

[11] Patent Number: 5,851,475
[45] Date of Patent: *Dec. 22, 1998

[54] SURFACE TREATMENT OF CERAMIC ARTICLES

[75] Inventors: Kyriakos Komvopoulos, Orinda; Ian G. Brown, Berkeley; Bo Wei, Daly City; Simone Anders; Andre Anders, both of Albany; C. Singh Bhatia, Morgan Hill, all of Calif.

[73] Assignees: Regents of the University of California, Oakland; IBM, San Jose, both of Calif.

[ * ] Notice: The term of this patent shall not extend beyond the expiration date of Pat. No. 5,476,691.

[21] Appl. No.: 667,502

[22] Filed: Jun. 21, 1996

Related U.S. Application Data

[63] Continuation of Ser. No. 306,501, Sep. 15, 1994, abandoned, which is a continuation of Ser. No. 185,608, Jan. 21, 1994, abandoned.

[51] Int. Cl.$^6$ ..................................................... B29C 71/00
[52] U.S. Cl. ........................................... 264/430; 264/483
[58] Field of Search ..................................... 264/430, 483

[56] References Cited

U.S. PATENT DOCUMENTS

| | | | |
|---|---|---|---|
| 4,251,297 | 2/1981 | Kawabata et al. | 148/121 |
| 4,499,515 | 2/1985 | Piotrowski et al. | 360/113 |
| 4,678,678 | 7/1987 | Kamigaito et al. | 427/38 |
| 4,681,813 | 7/1987 | Yamada et al. | 428/450 |
| 5,262,199 | 11/1993 | Desu et al. | 427/255.1 |
| 5,347,412 | 9/1994 | Nitta et al. | 360/103 |
| 5,476,691 | 12/1995 | Komvopoulos et al. | 427/527 |

OTHER PUBLICATIONS

I.G. Brown et al., "Novel Metal Ion Surface Modification Technique," *Applied Physics Letters*, vol. 58 No. 13, Apr. 1, 1991, p. 1392–1394.

A. Anders et al., "Low energy Ion Implantation/Deposition as a film Synthesis and Bonding Tool," Mat. Res. *Soc. Symp. Proc.*, vol. 316, 1994, pp. 833–844, presented Nov. 29 to Dec. 3, 1993.

I.G. Brown et al., "Plasma Synthesis of Metallic and Composite Thin Films with Atomically Mixed Substrate Bonding," *Nuclear Instruments and Methods in Physics Research*, vol. B80/81, 1993, pp. 1281–1287.

A. Anders et al., "Joining of Metal Films to Carbon–Carbon Composite Material by Metal Plasma Immersion Implantation," *Materials Research Society Symp. Proc.*, MRS Apr. 12–16, 1993 Mtg., V. 314, Aug. 1993, pp. 205–208.

I.G. Brown, "Plasma Synthesis of Thin Films and Multilayers with Tailored Atomic Mixing," *Plasma Synthes and Processing of Materials, Proceeding of a Symposium Held Feb. 22–25, 1993*, pp. 37–46, 1993.

S. Anders et al., Macroparticle—Free Thin Films Produced by an Efficient Vacuum Arc Deposition Technique *Journal of Applied Physics*, vol. 74, No. 6, Sep. 15, 1993, pp. 4239–4241.

*Primary Examiner*—Christopher A. Fiorilla
*Attorney, Agent, or Firm*—Fish & Richardson, P.C.

[57] ABSTRACT

A process for producing an article with improved ceramic surface properties including providing an article having a ceramic surface, and placing the article onto a conductive substrate holder in a hermetic enclosure. Thereafter a low pressure ambient is provided in the hermetic enclosure. A plasma including ions of solid materials is produced the ceramic surface of the article being at least partially immersed in a macroparticle free region of the plasma. While the article is immersed in the macroparticle free region, a bias of the substrate holder is biased between a low voltage at which material from the plasma condenses on the surface of the article and a high negative voltage at which ions from the plasma are implanted into the article.

12 Claims, 8 Drawing Sheets

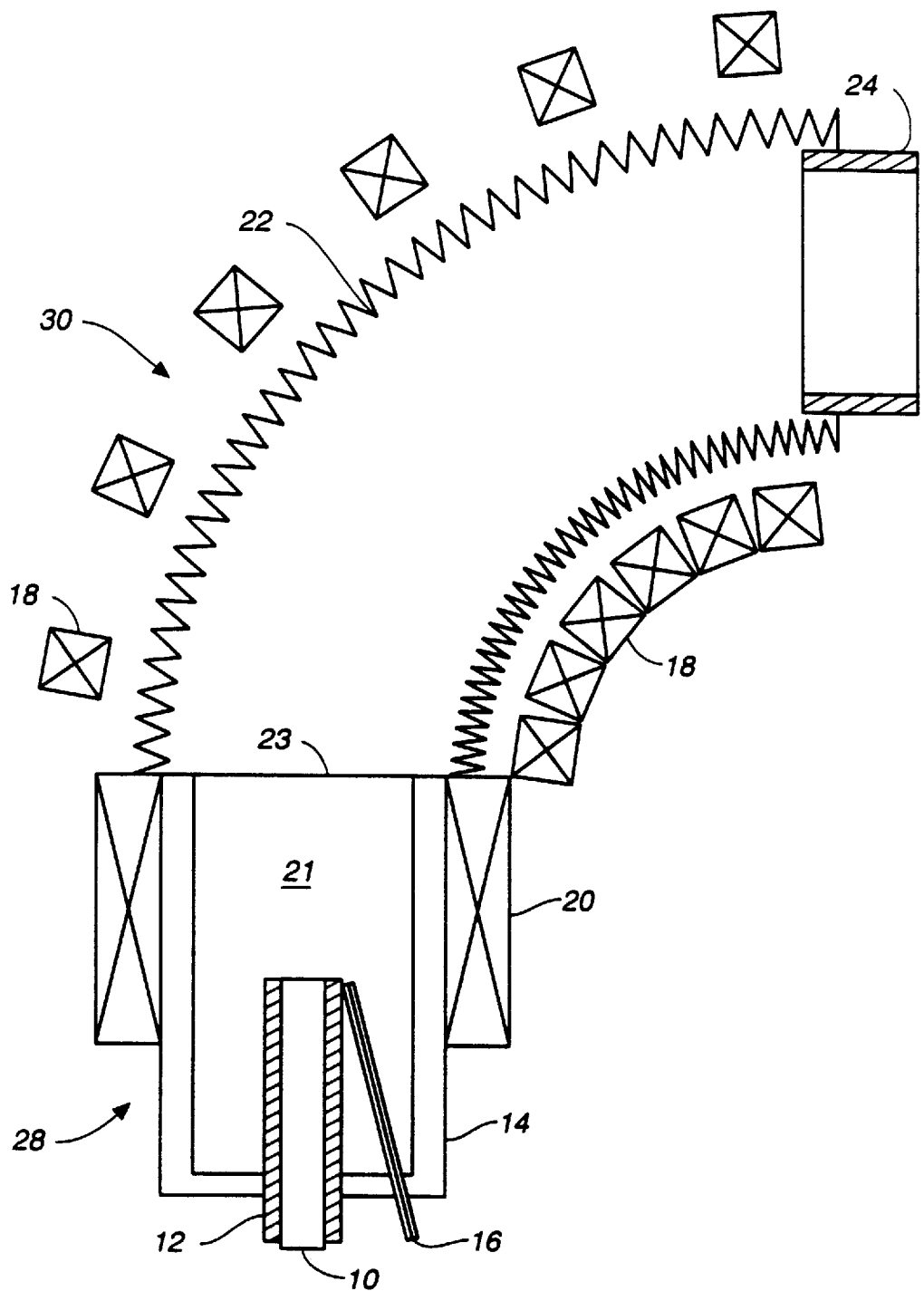
FIG._1

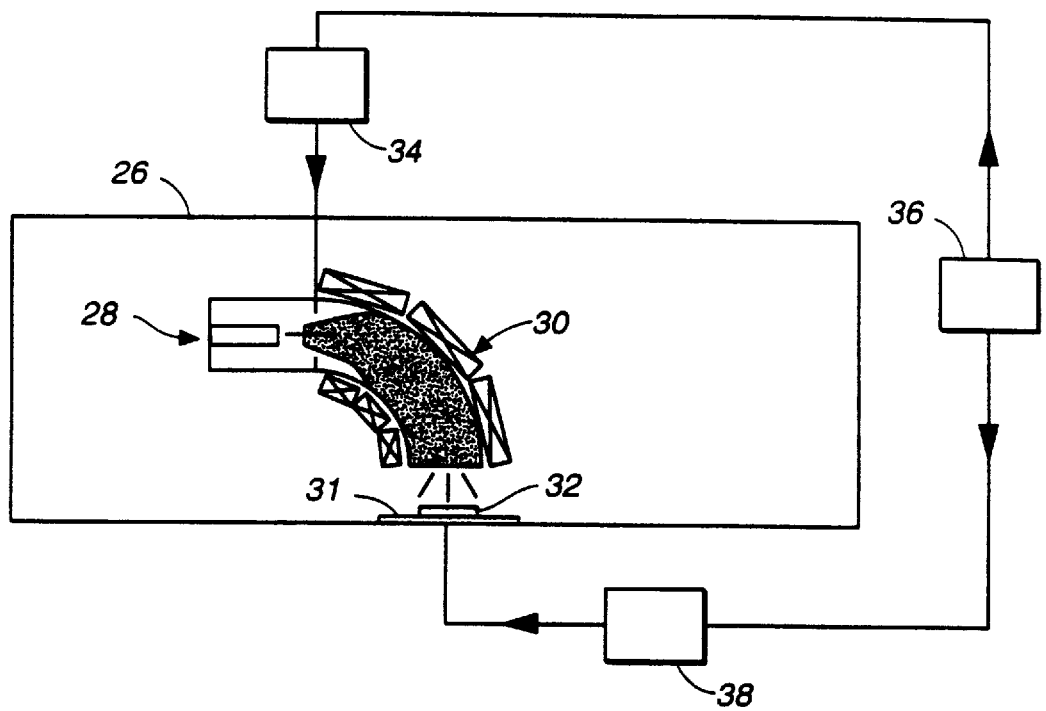
FIG._2
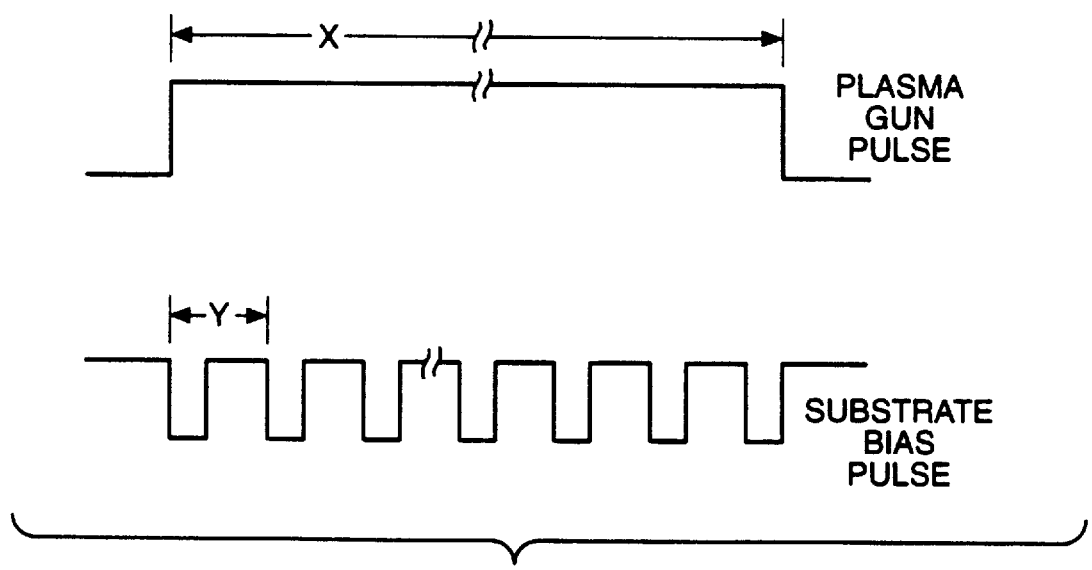
FIG._3

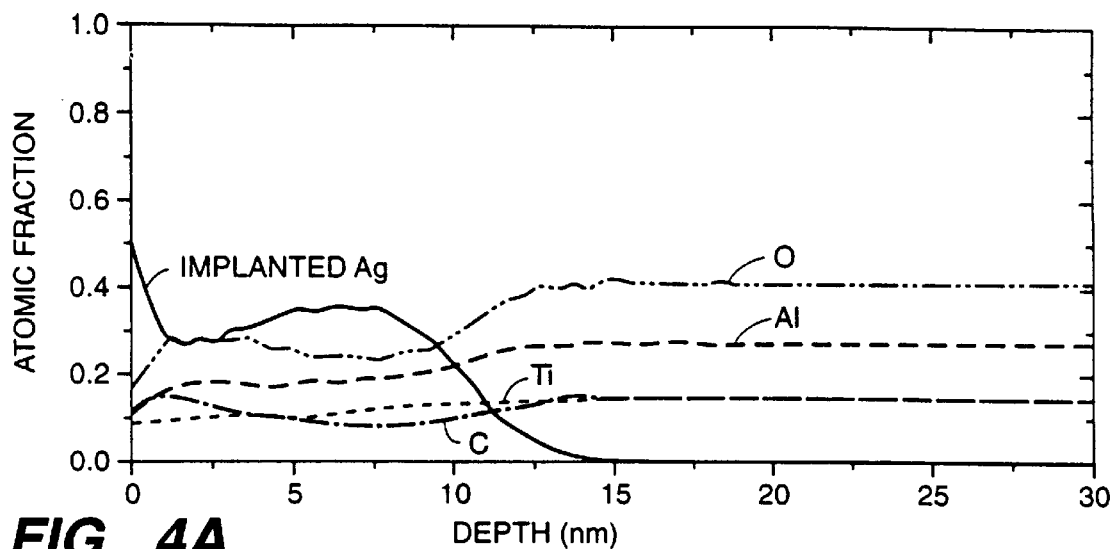
FIG._4A
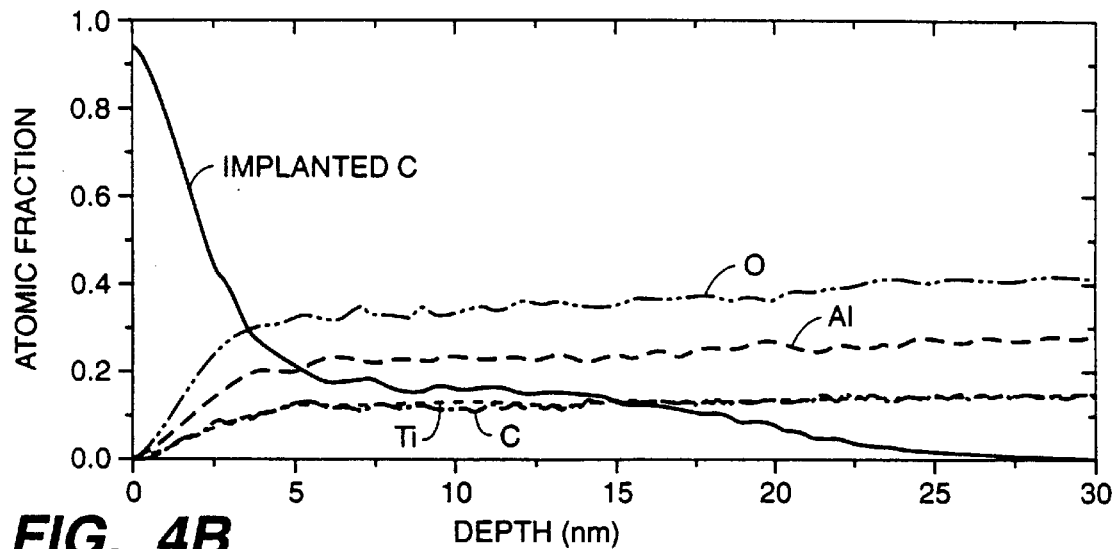
FIG._4B
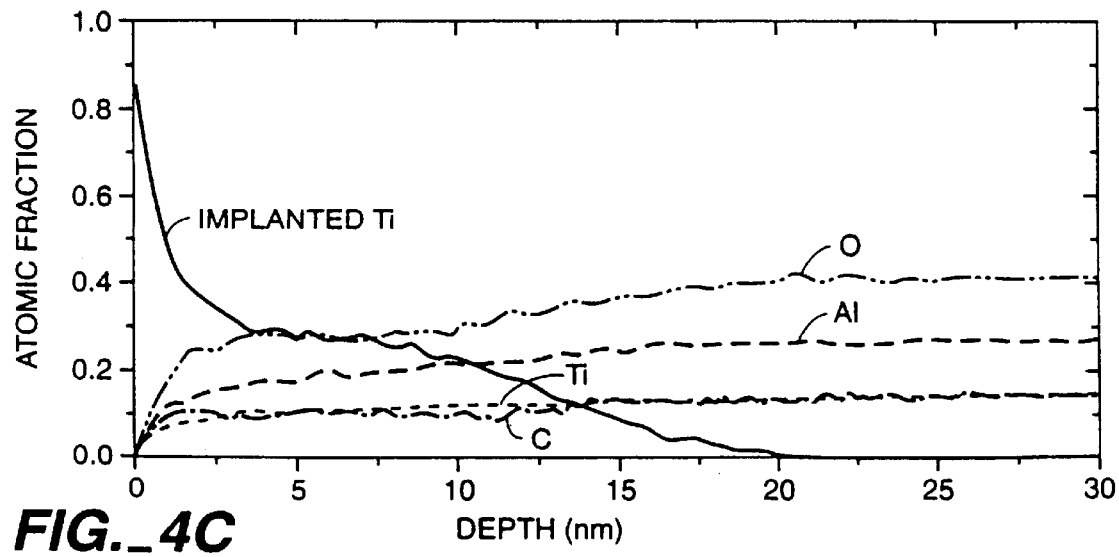
FIG._4C

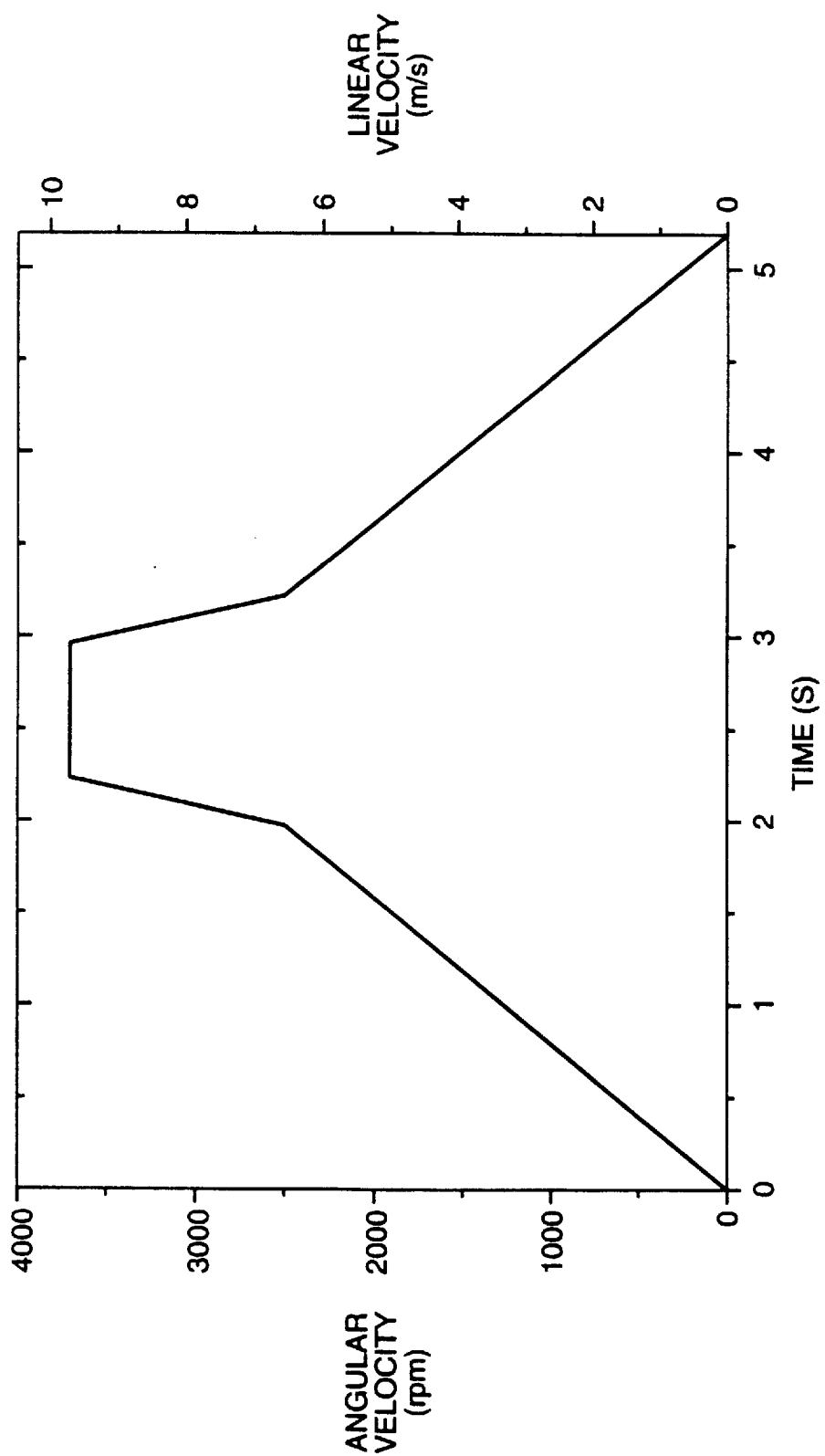
FIG._5

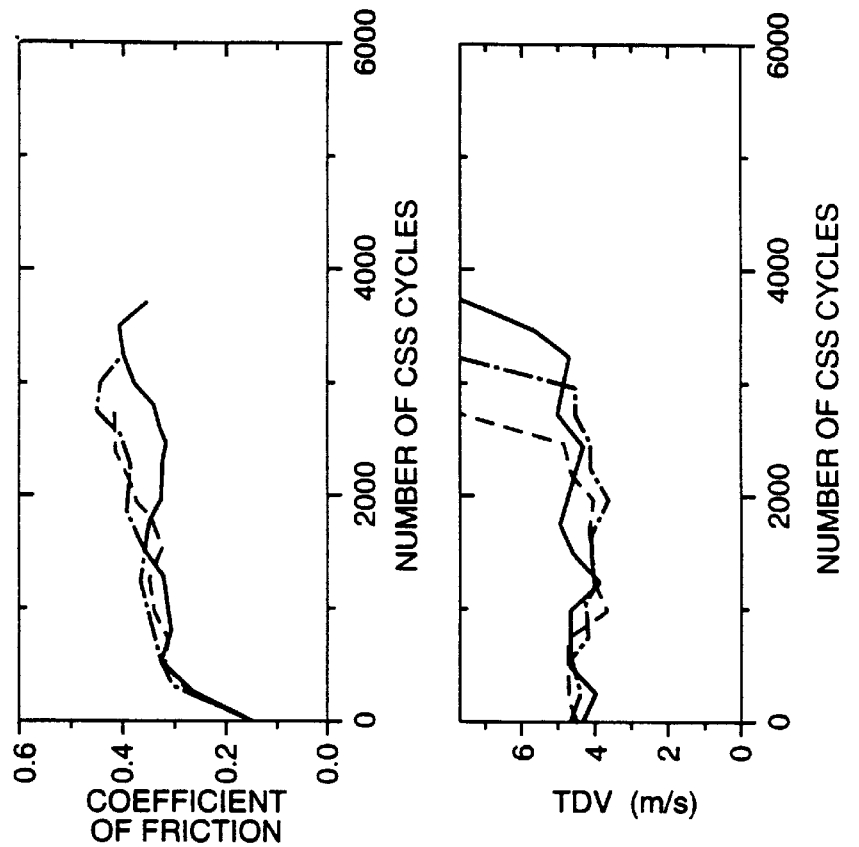
FIG._6B
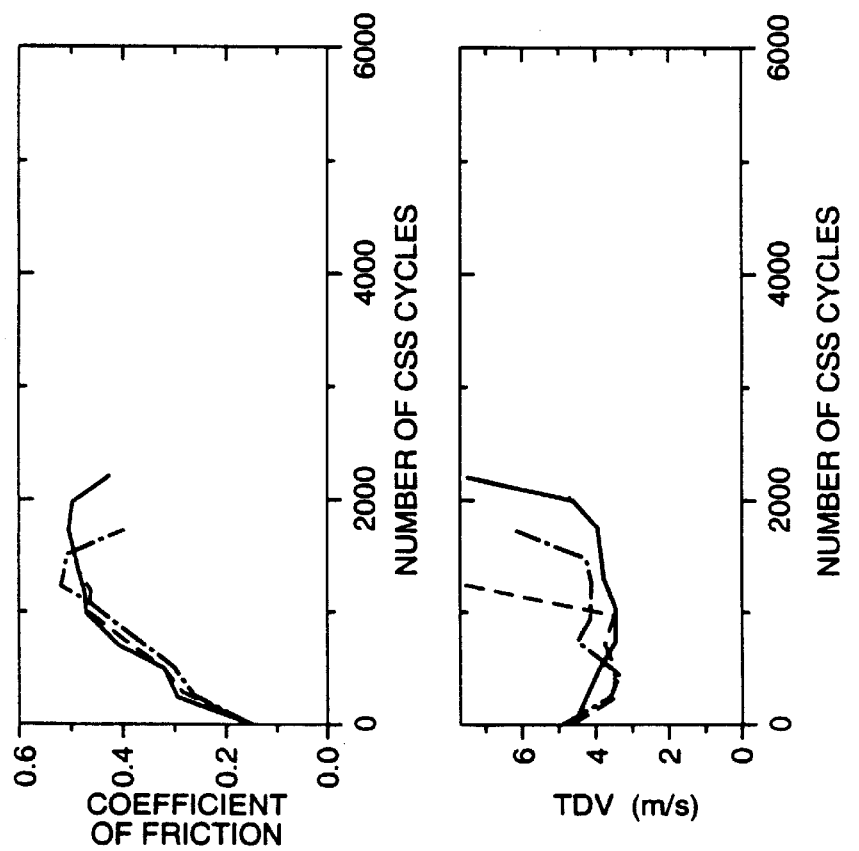
FIG._6A

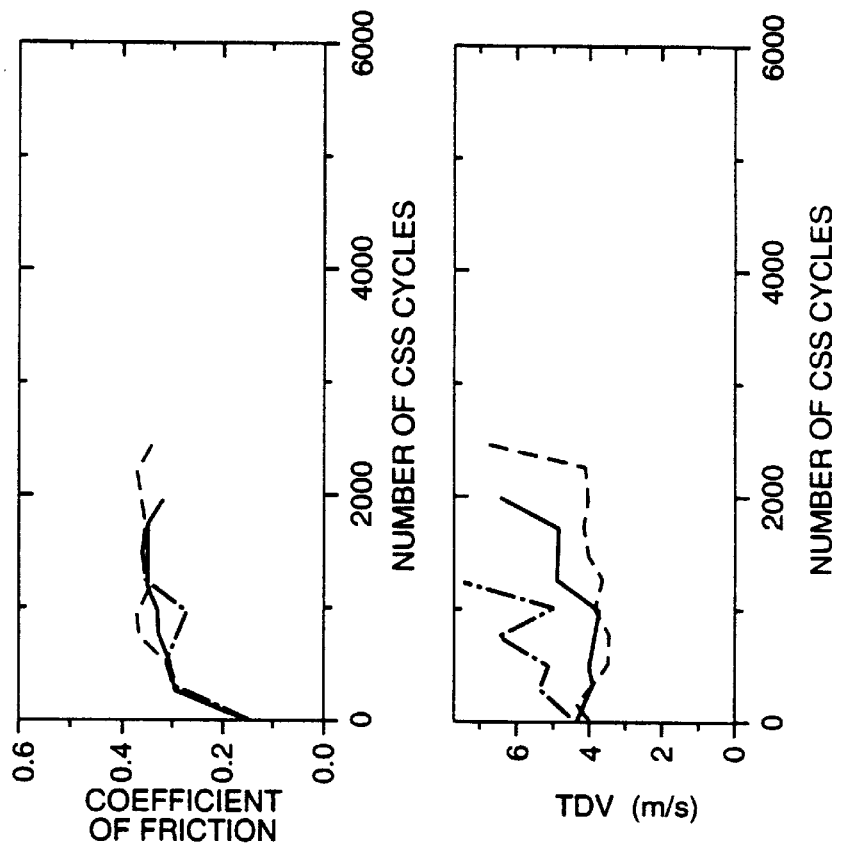
FIG._6D
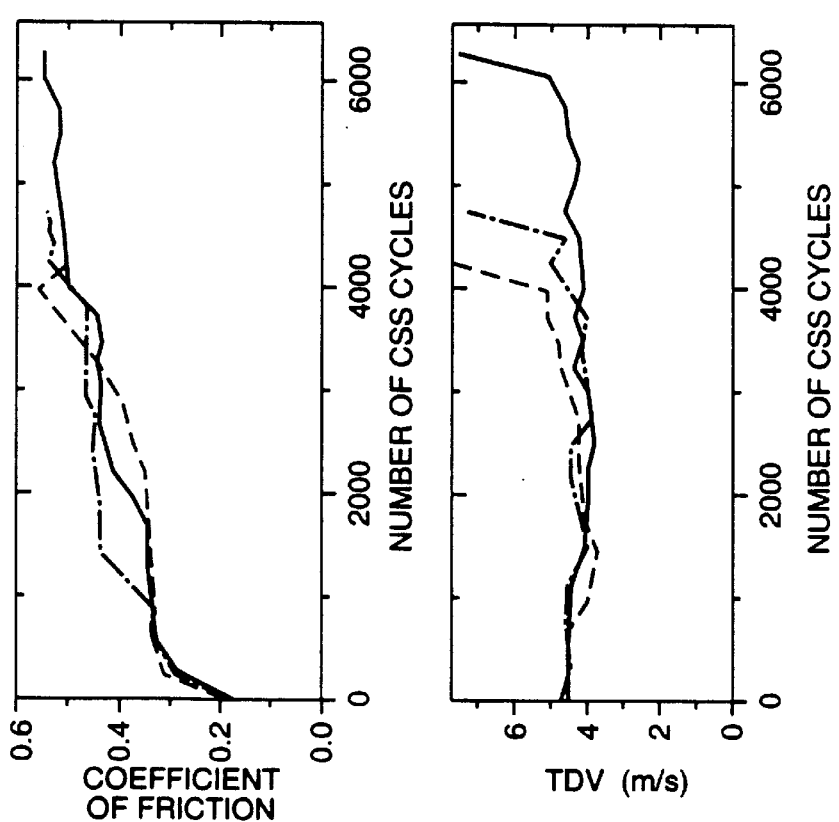
FIG._6C

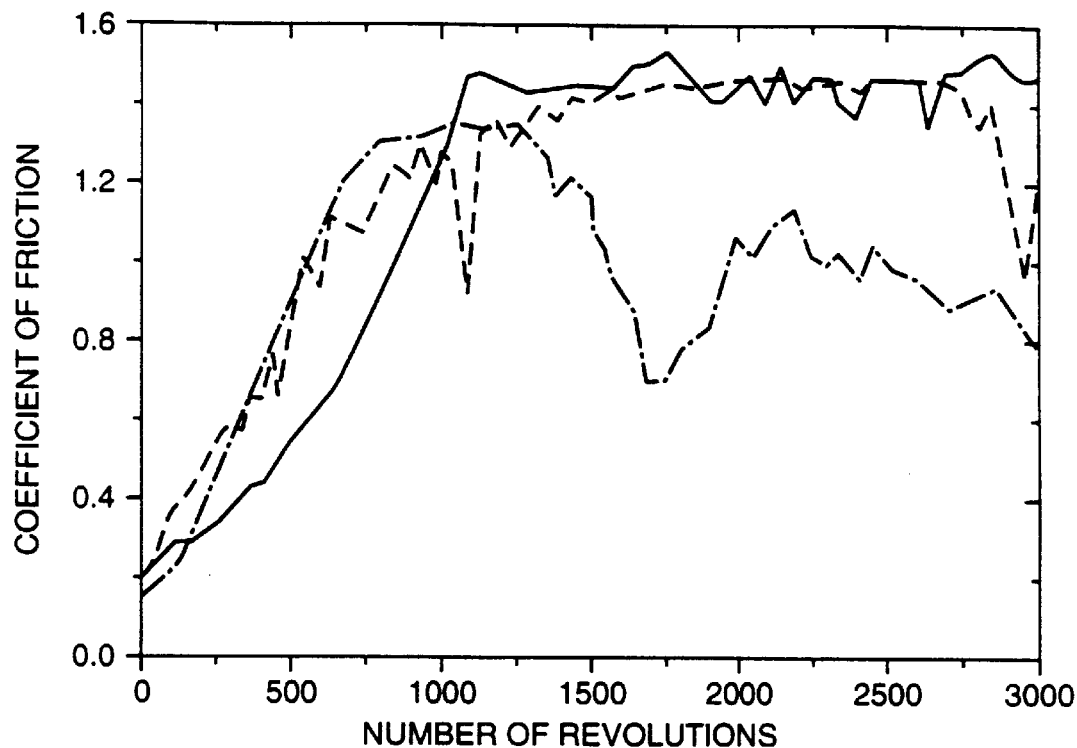
FIG._7A
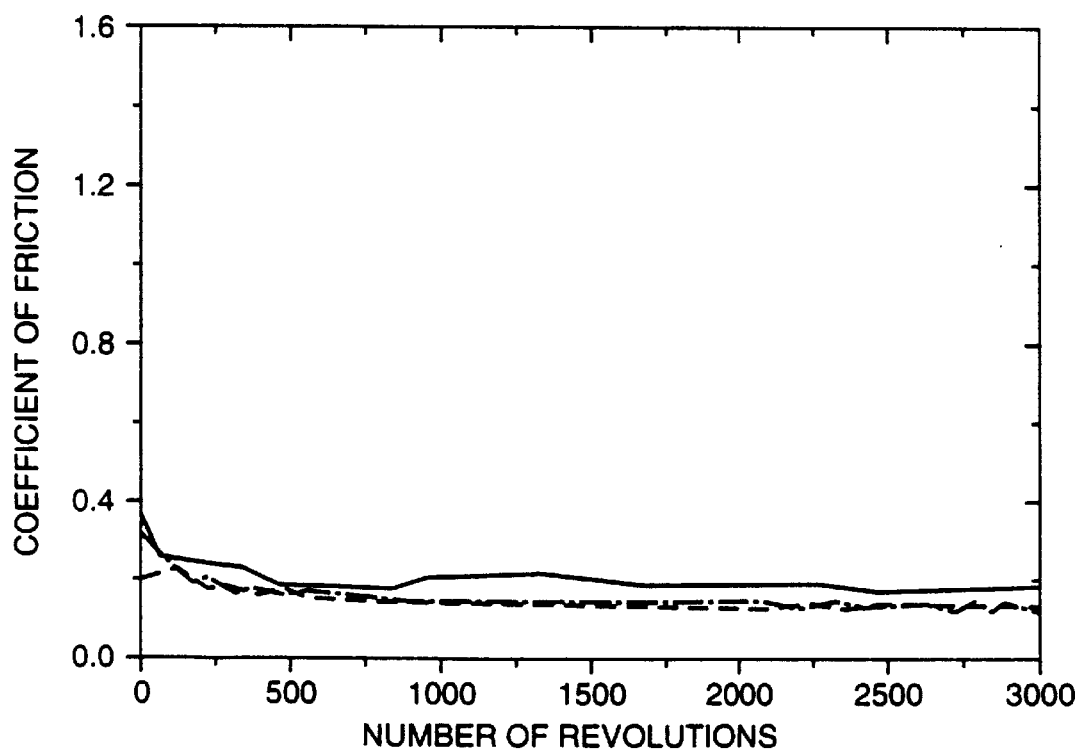
FIG._7B

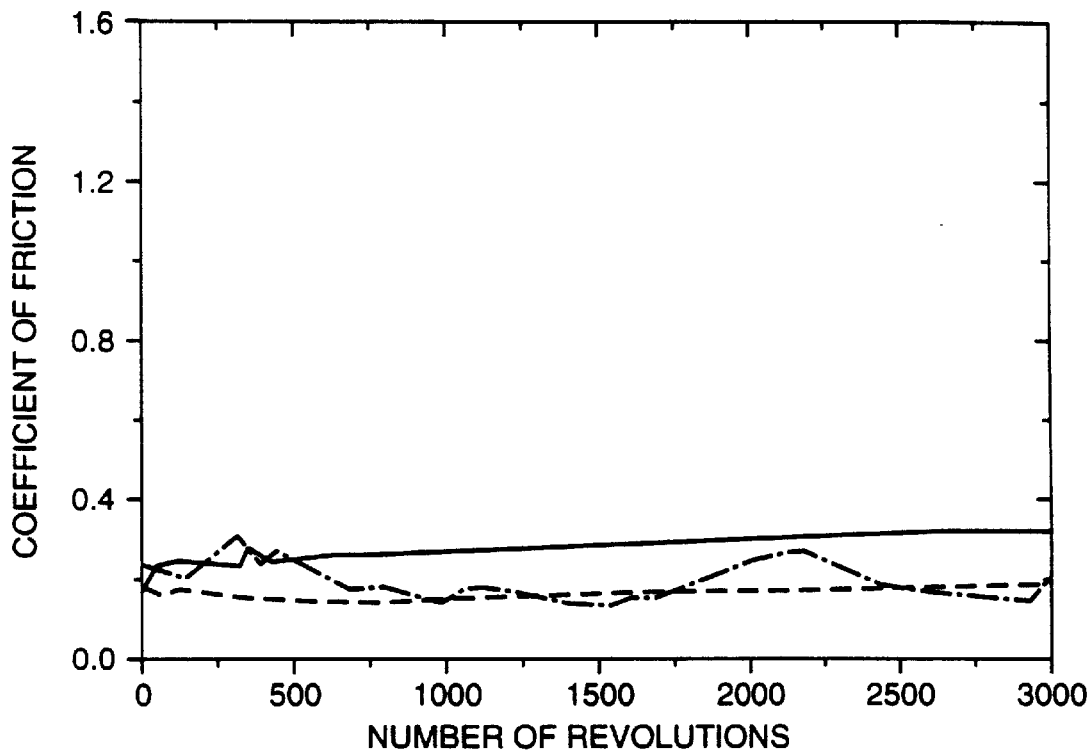
FIG._7C
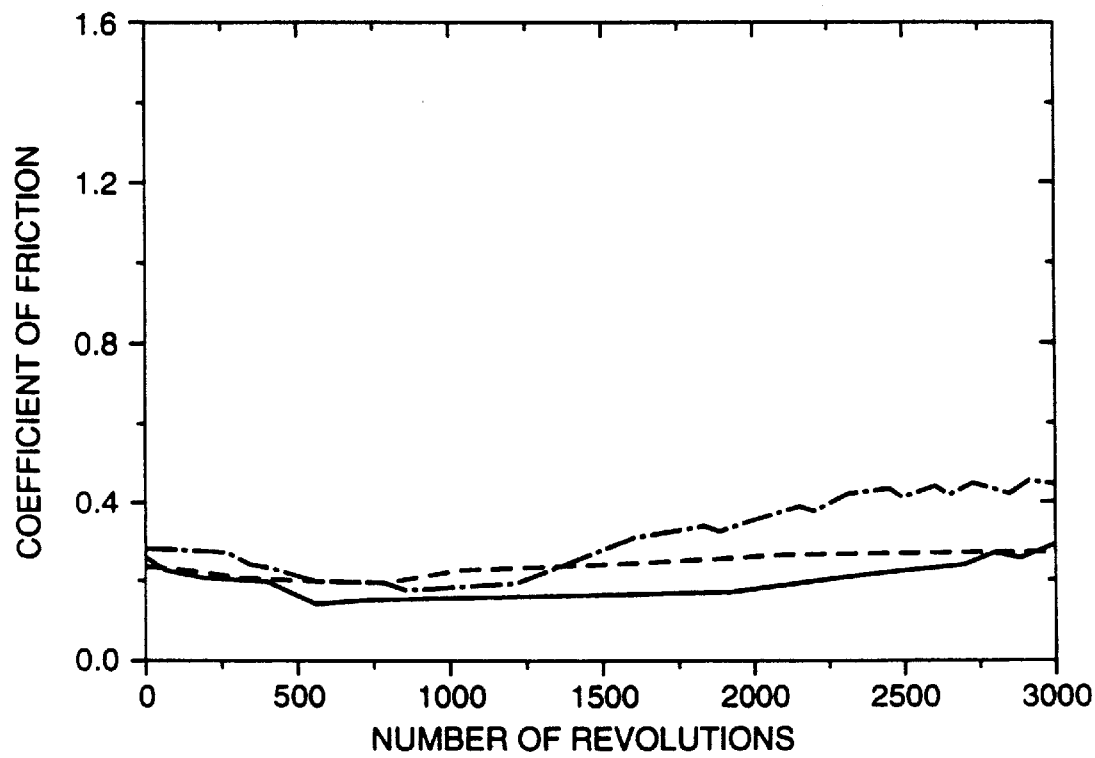
FIG._7D

SURFACE TREATMENT OF CERAMIC ARTICLES

This application is a continuation of prior application Ser. No. 08/306,501, filed Sep. 15, 1994, now abandoned, which is a continuation of application Ser. No. 08/185,608, filed on Jan. 21, 1994, now abandoned.

This invention was made with government support under Grant Nos. MSS-8996309 and DE-AC03-76SF-00098 awarded by the National Science Foundation and the U.S. Department of Energy. The Government has certain rights in this invention.

BACKGROUND OF THE INVENTION

The present invention relates generally to surface treatment of ceramics, and more particularly to a surface treatment for magnetic recording heads using plasma immersion ion implantation and deposition.

The use and development of plasma- and ion-assisted material modification processes to selectively alter the structure and physicochemical properties of surfaces has received increasing attention in recent years. In particular, ion implantation as a nonequilibrium process provides a unique means for developing surface layers with novel compositions and microstructures that are otherwise difficult or impossible to obtain. In conventional ion implantation, a beam of energetic ions extracted from a plasma source is accelerated toward the surface to be implanted. The ions impinging on the solid surface at high energy become buried at depths typically in the range of 0.01 to 1 microns ($\mu$m), thus resulting in the modification of the atomic composition and lattice structure of the near-surface region without affecting the surface roughness, dimensional tolerances, and bulk material properties, as in the case of other high-temperature vacuum coating techniques. Metallurgical reactions that occur with ion implantation, such as a solid solution of implant element, generation of dislocations and point defects, alteration of crystallinity (amorphization), precipitation of second phases and compound formation, and changes in the chemical composition and stress-strain state, can produce a significant hardening and strengthening effect on a thin surface layer which, in turn, may greatly enhance the fatigue life, oxidation resistance, and tribological properties, such as friction and wear, of a wide range of base materials used in various industrial and medical prostheses applications.

Since ion implantation is a line-of-sight operation, component manipulation and beam rastering are required in order to achieve spatial uniformity in treatment. This limits the size of the component that can be implanted (target) and imposes a need for special fixturing. Furthermore, the necessity to provide sufficient heat sinks and masking to inhibit excessive heating and sputtering of the target introduces additional complexity to the process. Plasma source ion implantation is a non-line-of-sight implantation technique of greater processing throughput which circumvents the aforementioned drawbacks and restrictions. The target is immersed in a plasma and repetitively pulse-biased to a high negative voltage relative to the plasma potential. A plasma sheath forms around the target and the ions accelerate through the electric field of the sheath bombarding all exposed areas of the target simultaneously. Although this process provides an effective means for achieving enhanced surface properties, it is limited to implanting species that are gaseous at room temperature, e.g., nitrogen and oxygen.

It is apparent from the foregoing that unique surface properties can be obtained with the plasma immersion ion implantation technique. One of the most rapidly emerging technologies where significant advancements in materials processing can be achieved with such a technique is magnetic recording media. As magnetic hard disk drives have evolved to higher storage densities, the head-disk spacing (flying height) has been reduced to the present state-of-the-art of ~0.1 $\mu$m. Remarkably smaller spacings, in the range of 0.025 to 0.05 $\mu$m, are predicted for the near future in view of the technology trend for much higher storage densities. Operation at such low flying heights enhances the intermittent contact of the magnetic recording head with the disk, thus resulting in friction build-up and accelerated wear damage of both head and disk surfaces. Although significant progress has been made toward the development of durable thin films for hard disks, surface modification of magnetic recording heads, or other ceramic articles, for enhancing the friction and wear characteristics at the head-disk interface has received relatively less attention.

Accordingly, an object of the present invention is to provide a method for improving the friction and wear properties of magnetic recording heads and other ceramic articles.

Another object of the present invention is to provide a method for enhancing the smoothness and hardness of magnetic recording heads and other ceramic articles.

Yet another object of the present invention is to provide a low temperature and short duration surface treatment for enhancing the smoothness, hardness, friction and wear properties of magnetic recording heads and other ceramic articles.

Still another object of the present invention is to provide a surface treatment for magnetic recording heads and other ceramic articles that can be carried out using a wide variety of solid metal, solid nonmetal and gaseous species.

A further object of the present invention is to provide a surface treatment for magnetic recording heads and other ceramic articles, yielding a combination of phases attainable by deposition and phases attainable by ion implantation with atomic interfacial mixing.

Another object of the present invention is to provide a surface treatment for magnetic recording heads and other ceramic articles wherein original tolerances are maintained.

Still another object of the present invention is to provide a surface treatment for modifying the surface resistivity of magnetic recording heads and other ceramic articles.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the claims.

SUMMARY OF THE INVENTION

The present invention is directed to a surface treatment for magnetic recording heads and other ceramic articles or substrates. A ceramic substrate, for example, may be held on a conductive substrate holder and enclosed in a low pressure ambient in a hermetic enclosure and immersed in a plasma comprising ions of a solid material. At the surface of the substrate, the plasma density may be in the range of about $10^6$ to $10^{13}$ ions per cubic centimeter ($cm^{-3}$). In the case of electrical conductors, such as metals, carbon and highly doped semiconductors, the plasma can be generated using a vacuum arc. A plasma containing these materials or insulators can also be generated by laser ablation. Any method can be used to generate this plasma as long as the substrate is not impacted by any macroparticles that are produced along with the plasma. Part of the time that the substrate is immersed in the plasma, the substrate holder is kept at a low potential close to the plasma potential such that material from the plasma condenses onto the surface of the substrate. At other times, the substrate holder is kept at a negative bias relative to the plasma such that ions from the plasma are accelerated and implanted into the substrate. This negative bias may be in the range of about 20V to 100 kV, and may be pulsed with a duty cycle of at least about 1%. The total dose of ions impinging on the substrate may be in the range of about $10^{14}$ to $10^{18}$ ions per square centimeter ($cm^{-2}$).

BRIEF DESCRIPTION OF THE DRAWINGS

The accompanying drawings, which are incorporated in and constitute a part of the specification, schematically illustrate a preferred embodiment of the invention and, together with the general description given above and the detailed description of the preferred embodiment given below, serve to explain the principles of the invention.

FIG. 1 is an enlarged schematic illustration of a plasma gun and magnetic filter for the practice of the present invention.

FIG. 2 is a simplified diagrammatic illustration of a surface treatment apparatus for the practice of the present invention.

FIG. 3 is a timing diagram of a processing cycle.

FIGS. 4A–4C are simulated depth profiles of surfaces of magnetic recording heads treated according to the present invention.

FIG. 5 is a velocity versus time profile for contact start stop (CSS) tests.

FIGS. 6A–6D show measured coefficient of friction and touchdown velocity (TDV) versus the number of CSS cycles.

FIGS. 7A–7D show the evolution of the coefficient of friction with the number of sliding revolutions.

DESCRIPTION OF THE PREFERRED EMBODIMENT

The present invention will be described in terms of the preferred embodiment. The preferred embodiment is a surface treatment process for ceramic substrates such as magnetic recording heads and the articles so treated.

The treatment of the present invention requires that the substrates be immersed in a plasma comprising ions of a solid material. Such a plasma may be produced by laser ablation or, in the case of conductive materials, by a vacuum arc plasma gun.

As shown in FIG. 1, a plasma gun 28 comprises a cathode rod or disk 10 in the central part of the gun, surrounded by a ceramic insulator 12 and a cylindrical anode 14. The arc pulses are initiated by a short (of order 10 microseconds) high voltage (for example 15 kilovolts) trigger spark between cathode 10 and a trigger electrode 16. A magnetic field is provided across anode chamber 21 by a solenoid 20. The plasma is created on the cathode surface and leaves the source through aperture 23 of chamber 21.

Cathodic arcs are characterized by plasma production at micron-size, non-stationary cathode spots. Their "pure" occurrence can be observed as vacuum arcs; i.e., when no gas is present between the electrodes, and. thus the plasma carrying the arc current is exclusively produced in the cathode spots. The cathode material undergoes a complicated transition from the solid to a plasma, and this transition is different from evaporation or sputtering since little neutral cathode vapor is involved. The principal cathode spot mechanisms remain the same if a gas is present and if the cathode temperature is relatively low. From this point of view, "cathodic arcs" include a broader class of discharges than "vacuum arcs".

The pressure within the cathode spots is extremely high (up to $10^{10}$ Pascal (Pa)=$10^5$ bar), and 10 the dense plasma rapidly expands into the vacuum or low-pressure gas ambient driven by the intense pressure gradient. Ions are accelerated by the combined forces of the pressure gradient, local electric fields, and electron-ion friction. It has been found that the final ion velocity for all cathode materials is about $1-2\times10^4$ meters per second (m/s), corresponding to ion energies of 20–200 electron volts (eV) depending on the ion mass.

The use of cathodic arc plasmas implies a directed flow of plasma, and therefore one typical feature of "conventional" gaseous plasma source ion implantation, namely implanting simultaneously into all sides of the substrate, is lost. The picture is similar to ion beam implantation: the surface facing the plasma flow is treated while the side and downstream surfaces remain nearly unchanged. Plasma source or substrate motion is necessary if an all-side treatment is required, or several sources must be used simultaneously or sequentially.

Cathodic arcs can be produced in the broad range between submicroseconds and d.c. operation. It is often convenient to use a pulse forming network or even just a simple capacitor and load resistor (of order 1 Ω) to obtain repetitive arc discharges of, for instance, 100 microseconds ($\mu$s) –1 second duration.

Plasma source ion implantation with a metal (and carbon) plasma results in surface modifications qualitatively different from those obtained with a gaseous plasma. Since direct ion implantation and recoil ion implantation occur concomitantly during the high-voltage bias pulses (implantation phase) and the metal plasma condenses and remains on the surface as a film between the bias pulse (deposition phase), this surface modification process is referred to as metal plasma immersion ion implantation and deposition. Thus, a wide range of material modifications can be obtained by adjusting the implantation/deposition duty cycle and the magnitude of the substrate holder bias voltage, while with the optional use of reactive gases compound films can be also produced. Of particular significance is the increased solid solubilities of condensable species obtained from recoil collision cascades and the interface tailoring on an atomic scale resulting from the mixing of the film and substrate materials.

Intermixing greatly enhances the film adhesion and reduces stresses due to lattice mismatches.

Cathodic arc plasma sources for thin film formation can be operated either in a repetitively pulsed mode with an arc pulse duration between 50 $\mu$s and hundreds of milliseconds or d.c. The arc current may be in the range of 5–2000 amperes (A) and is typically in the range of 100–250 A. Guns operated with short pulses and moderate repetition rates (up to 5 pulses per second) do not require cooling if thin films of thickness between monolayers and 50 nanometers (nm) are deposited. For films of medium thickness (10–500 nm), arc pulses of up to 5 ms duration at a repetition rate of a few pulses per second can be used. For thick films (100 nm to many microns), water-cooled plasma guns can be operated in a long-pulse or d.c. mode of operation. Here the average power becomes substantial, and substrate cooling is required. Arc repetition rates for the practice of the present invention may be in the range of 0.1–100 pulses per second and more preferably in the range of 0.5–10 pulses per second.

All metals, alloys, highly-doped semiconductors, and carbon can be used as cathode material. Thus, cathodic arc deposition can be used for a broad range of thin film structures. Particularly attractive in the context of the present invention are silver (Ag), carbon (C), titanium (Ti), gold (Au), platinum (Pt), copper (Cu), tungsten (W), tantalum (Ta), molybdenum (Mo), aluminum (Al), hafnium (Hf) and silicon (Si). The range of films can be considerably extended by operating in a reactive gas ("reactive deposition"). Metal ions from the cathodic arc plasma source react in transit to the substrate or at the substrate surface forming compound films. The base pressure of the vacuum system may be about $10^{-6}$ Torr; and the pressure of the working gas may in the range of 1–500 mTorr when compound films are deposited.

It is an inherent feature of the cathode spot that not only plasma is formed from the cathode material but also liquid droplets (solid particles in the case of carbon). These droplets are of size up to 10 $\mu$m; they are often called "macroparticles" to emphasize their massive nature compared to plasma particles. Macroparticles are mostly larger than the thickness of the films to be deposited, and film quality can be very poor if a cathodic arc plasma is used without special "cleaning" measures.

A method for separating plasma and macroparticles is to use a curved magnetic field. The underlying idea of filtering is that the macroparticles travel in nearly straight lines due to their inertia while the plasma can be guided to a substrate location which is out of line-of-sight to the cathode spot. Electrons are magnetized (the radius of their trajectory is much smaller than the duct minor radius, and they perform many cycles before suffering a collision), and thus they follow the magnetic field lines. Ions are bound to the electron motion by plasma-internal electric fields, and consequently the plasma as a whole follows the magnetic field lines.

Filtering works only in vacuum and gases at very low pressure since one necessary condition of electron magnetization is that the electron collision frequency is much smaller than the electron cyclotron frequency. At very high pressures, plasma-gas interaction becomes dominant and the cathodic plasma loses its jet-like character which is essential for the plasma transport through magnetic filters.

For macroparticle filtering, a magnetic duct 30 of suitable size is used so that the plasma streams directly from anode chamber 21 of plasma gun 28 into the magnetic duct (see FIGS. 1 and 2). The magnetic field is provided by solenoids 18. A bent tube 22, such as bellows, and solenoids form the filter. The solenoids could be replaced by a system of permanent magnets. The efficiency of plasma transport can be enhanced by using a conductive tube wall with positive bias. With optimum magnetic field configuration and optimum bias of the filter wall, about 25% of the ions produced in the arc discharge can be transported through the filter. The magnetic field of the filter may make it difficult to trigger the pulsed vacuum arc. This difficulty may be overcome by connecting filter solenoids 18 in series with the plasma gun, such that the magnetic field is on only after the arc has been triggered. The filter wall 22 preferably has a sharp ribbed structure to trap the macroparticles. As shown in FIG. 1, stainless steel welded bellows having such a structure may be used for this purpose. A glass tube 24 may be inserted in the exit of the bellows to prevent the formation of anode spots at the sharp duct edges. A substrate 32, such as a magnetic recording head, is held on conductive substrate holder 31 beyond tube 24 (see FIG. 2). The deposition rate depends on the plasma density at the substrate, which in turn depends on the arc current and on the distance of the sample or substrate to the filter exit. The plasma density at the substrate may be in the range of $10^6$–$10^{13}$ cm$^{-3}$ and more preferably $10^8$–$10^{11}$ cm$^{-3}$. The larger the filter exit to substrate distance, the better the homogeneity of the film and the lower the deposition rate. The distance between the filter exit and the substrate may be as large as 2 m, and more preferably 2–50 cm. For example, if the distance between filter and substrate is 10 cm, the area of deposition is ~10 cm in diameter but only the central part of about 2.5 cm diameter can be considered to be homogeneously deposited (deviations of film thickness <10%). The actual deposition rate (during the arc pulse) may be of the order 10 nm/s, depending on the cathode material, arc current, filter parameters, etc. The average deposition rate is, of course, smaller and depends on the arc duty cycle. The total dose, which depends on the arc duty cycle and the total process duration, is in the range of $10^{14}$–$10^{18}$ $cm^{-2}$ and more preferably $10^{15}$–$10^{17}$ $cm^{-2}$. For the plasma immersion implantation phases, the substrate holder may be biased using a high voltage pulse generator.

As shown in FIG. 2, the surface treatments may be performed in a vacuum vessel 26. Inside vessel 26 are plasma gun 28 and magnetic filter 30. Substrate 32 is positioned on conductive substrate holder 31 at one end of filter 30 beyond tube 24 (see FIG. 1) and plasma gun 28 is situated at the other end. A pulse generator 36 provides timing signals to substrate holder bias pulser 38 and plasma gun pulser 34. As is well known in the art, the substrate holder bias pulser may be a high voltage pulse generator that controls the substrate potential, and the plasma gun pulser may be a pulse forming network that powers the plasma gun and the macroparticle filter solenoids.

The processing cycle is shown schematically in FIG. 3. The plasma gun pulse duration X is usually much greater than the substrate holder bias pulse period Y such that the substrate holder bias alternates between a low value and a high magnitude negative value while the substrate is exposed to the arc plasma.

Surface modification of ceramic substrates may be accomplished in a sequence of two alternating phases, i.e., ion implantation and deposition in the presence or absence of a substrate holder bias voltage, respectively. For a certain time period, the substrate is subjected to a pulse of a negative potential to accelerate the positive ions of the plasma across the sheath electric field and implant them into the substrate. The pulse may be as short as 100 nanoseconds (ns), and more preferably in the 1–20 microsecond ($\mu$s) range. The presence of multiply charged ions, which is typical of vacuum arc plasmas, is advantageous since it reduces the required bias voltage for a desired ion energy or implantation depth. The bias voltage may be between 20V and 100 kV and more preferably in the range of 100V–10 kV. Between the high-voltage bias pulses, the substrate holder is maintained at near ground potential. In the absence of bias, metal ions arriving at the substrate surface form a film (their sticking coefficient is close to one). Ions have a considerable energy even in the absence of bias, which is associated with their flow velocity. Therefore, they are energetic enough to overcome local potential barriers which hinder motion along the surface. Ions move on the surface sufficiently to be trapped at favorable sites. Metal films produced by filtered vacuum arc plasmas are therefore denser and smoother than those fabricated with other deposition methods such as sputtering or evaporation.

In this technique, therefore, surface modification is achieved in a controlled fashion by means of combining the ion implantation and surface deposition processes. The substrate holder bias duty cycle may be as low as 1% and more preferably 5–50%.

As the implantation and deposition phases are alternated, the freshly deposited film is bombarded with energetic ions. Both direct and recoil implantation are characteristic of plasma immersion ion implantation and deposition. At the beginning of the process, an intermixed layer is formed by direct and recoil implantation so the film material merges gradually into the substrate material. Intermixing of film and substrate is responsible for the superior adhesion of the resultant films formed. Intermixing also reduces the stress associated with the structural mismatch of substrate and film material. As the film grows, an increasing fraction of ions is implanted not only into the original substrate but also into the deposited film. When the growing film is thicker than the implantation depth, ion implantation does not contribute anymore to intermixing but may be essential to the structure of the film. The ratio of the deposition and implantation phases is important for the film formation process. The process of the present invention may be carried out starting with commercially available ceramic heads (sliders). For example, the heads may be two-rail heads and consist of alumina ($Al_2O_3$) and titanium carbide (TiC) at weight concentrations of 70% and 30%, respectively, and exhibit a root-mean-square (rms) surface roughness of 2–3 nm. The rails may be shaped to be approximately 0.5 mm in width and 4 mm in length with leading edges tapered at an angle of 10–15 milliradians (mrad) to enhance the formation of an air bearing during operation.

Ceramic head surfaces were treated with silver, carbon, and titanium plasmas generated by repetitive vacuum arc discharges using the process of the present invention as described above. Although carbon is not a metal, its graphitic phase can be used as the arc cathode material. Since the condensing hard carbon film contains a high fraction of tetrahedral ($sp^3$) bonding, it may be possible to produce an ultra-thin and hard surface layer consisting of hydrogen-free amorphous diamond, as demonstrated for silicon substrates.

The substrates may be treated with fixed ion doses of the order of $3 \times 10^{16}$ ions/cm$^2$, which may be achieved in 5 minutes or less. Longer process times are also possible, if desired. The plasma gun is usually operated in a pulsed mode with an arc current of the order of 100 A, pulse duration of the order of 5 ms, and repetition rate of about 2–5 pulses per second. For the plasma immersion implantation phases, the substrate holder may biased using a high voltage pulse generator. The bias pulse duration may be 1–20 µs, with a bias duty cycle typically between 10% and 50%. The heads may be placed on a substrate holder which may be repetitively biased to a high voltage of −2.0 kV in short pulses of duration 5 µs and frequency 67 kHz, thus yielding a 30% bias-pulse duty cycle. For these parameters, the implantation dose for the 30% duty cycle, therefore, may be $1 \times 10^{16}$ ions/cm$^2$. The duct exit-to-substrate distance may be about 10 cm.

With this surface modification scheme, ion implantation, recoil implantation, and ion beam mixing occur during one-third of the processing time and deposition in the remaining time. For the parameters given, the instantaneous deposition rate and the time-averaged rate may be 2.0 and 0.01 nm/s, respectively. Because the vacuum arc plasma is almost fully ionized with a mean ion charge state generally between $1^+$ and $3^+$, the mean ion energy is greater than the applied voltage by this factor. Thus, the mean implantation energy of both silver and titanium ions may be 4.2 keV, while that of carbon ions may be 2.0 keV. For the 30% bias-pulse duty cycle, the ion dose between pulses (deposition phase) may be $2 \times 10^{16}$ ions/cm$^2$ and the ion energy may be in the range of 20 to 100 eV. The plasma density may be on the order of $6 \times 10^{10}$ cm$^{-3}$ and the plasma flow velocity may be on the order of $10^4$ m/s.

FIGS. 4A–4C show results from simulations revealing the concentration of implanted elements as a function of depth from the surface of ceramic recording heads treated according to the above process parameters. The shapes of the profiles demonstrate that direct ion implantation, recoil implantation, and deposition can be accomplished simultaneously with the surface modification technique of the present invention. The thickness of the layers modified with silver, carbon, and titanium ions are 13, 25, and 18 nm, respectively, as shown in FIGS. 4A, 4B, and 4C, respectively. FIG. 4A shows that the silver-modified layer possesses a relatively uniform composition, except at the surface where the concentration of implanted silver ions was a little higher. Surface deposition in conjunction with ion implantation is mostly apparent in the elemental depth profiles shown in FIGS. 4B and 4C. The markedly higher atomic fractions of carbon and titanium adjacent to the surface suggest that the modified heads were also coated with ultra-thin (2–3 nm) layers rich in carbon and titanium, respectively. Since these compositional modifications change the free energy and shear strength of the head surface, significantly different friction and wear properties can be obtained.

The effect of the present surface modification technique on the surface topography characteristics of ceramic heads was studied with an atomic force microscope (AFM). Six measurements of the rms and peak-to-valley (pv) roughness parameters were obtained from different AFM images for each head surface condition. The rails of tested heads and the wear tracks on the disks were examined with an optical microscope at high magnifications. The hardnesses of the modified layers were determined by means of a point contact microscope, which is based on the same principle of operation as the AFM. With this technique, nanoindentations were performed with a three-sided pyramid diamond tip of radius less than 100 nm and apex angle of 80 degrees. The diamond tip was mounted on a single leaf spring of stiffness 73 Newtons per meter (N/m). For each type of head, six indentations were performed under a fixed load of 66 microNewtons (µN). This light load was selected to obtain indentation depths in the range of 5 to 8 nm in order to minimize the effect of the properties of the unimplanted bulk material on the hardness measurements. The indented surface topography was imaged in situ with the same tip at a scan load in the nanoNewton (nN) range. The hardness was calculated by dividing the indentation load with the projected area of the imaged indentation. In the statistical analysis, the roughness and hardness data were assumed to follow normal distributions. Statistical atomic force microscopy (AFM) data of the rms and pv roughness parameters are listed in Table I. The results show that significant surface smoothening of ceramic heads can be achieved with the present invention. Surface modification of the heads produced hardnesses slightly higher than that of the original two-phase ceramic material. The mean and standard deviation values of the relative hardness, defined as the hardness ratio of modified-to-unmodified heads, are also listed in Table I. The statistical scatter is attributed to the different hardnesses of the two ceramic phases and the appreciably smaller size of the nanoindentations relative to the average grain size. Since the hardness depends on both the diamond tip radius and indentation load, it is preferred to consider the relative hardness to compare quantitatively the mechanical strength resulting from different modifications. The results indicate that the present surface modification technique enhanced the hardness of the ceramic heads by approximately 7 to 18%, depending on the type of implanted ions. It should be realized, however, that the measured hardnesses are more representative of the subsurface regions where direct and recoil implantation occurred. Characterization of the near-surface regions where film deposition was the principal modification process was not possible due to surface roughness effects and the extremely small film thickness (2–3 nm) involved.

TABLE I

Roughness parameters and relative hardness of unmodified and modified magnetic recording heads.

| Head | Roughness Parameters | | Relative Hardness |
| --- | --- | --- | --- |
| | rms (nm) | pv (nm) | |
| Unmodified | 2.72 ± 0.89 | 25.9 ± 4.1 | 1.00 |
| Ag-modified | 1.98 ± 0.43 | 15.8 ± 2.3 | 1.07 ± 0.14 |
| C-modified | 1.82 ± 0.34 | 21.4 ± 4.1 | 1.18 ± 0.16 |
| Ti-modified | 1.94 ± 0.51 | 16.9 ± 3.0 | 1.17 ± 0.17 |

To evaluate the effects of the surface modification technique of the present invention on the friction and wear characteristics of magnetic head/disk interfaces, both modified and unmodified heads were rubbed against carbon-coated rigid disks. Contact-start-stop (CSS) and continuous sliding (drag) experiments were conducted with a computer-controlled wear tester placed in a class 100 clean-air hood in a laboratory environment with 35–45% relative humidity and $-27°$ C. ambient temperature. The tester consisted of a variable speed spindle on which the disk was clamped, a lead-screw actuator driven by a step motor for testing at different radial positions, and a load/friction wire strain gauge transducer on which the suspension of the head was attached. To avoid complications associated with wear particle contamination, a new head and a new disk were used in each experiment. A fixed normal load of about 16 grams (g) (0.1566N) was used in all the CSS and drag test.

Lubricated thin-film rigid disks with a protective carbon overcoat were used to conduct the CSS tests. The acceleration, time at maximum speed, and deceleration were chosen to simulate typical disk drive operating conditions. The velocity versus time profile for CSS testing is shown in FIG. 5. The average values of both friction force and touchdown velocity (TDV) over one revolution were recorded at intervals of 250 cycles throughout the tests. The TDV represents the velocity at which detectable physical contacts occur as the disk velocity is gradually reduced. Thus, the TDV was defined as the velocity corresponding to a sudden increase in the strain gauge signals. This was accomplished by decelerating from a velocity of 7.63 m/s at a rate of 0.05 m/s$^2$, and sampling the signals from the load and friction force transducers at each second. Although an abrupt increase in the TDV and the friction force can both be considered as failure criteria, the presence of small amounts of loose wear debris at the interface and material transfer on the head surface can usually be detected first by the TDV, much earlier than the formation of a visible wear track on the disk surface. That the TDV exhibits a higher sensitivity to the early stage of wear debris formation than the friction force was also observed in the CSS tests. Almost all tests were interrupted due to the TDV reaching a set threshold value of 6 m/s.

Unlubricated carbon-coated disks were used in all the continuous sliding tests. All experiments were performed at a fixed radial distance of about 30 mm and a low sliding speed of 3 cm/s, to avoid any runout effects and lifting of the head due to the establishment of an air bearing film, respectively. The number of sliding revolutions was fixed at 3000. In the first 500 revolutions the friction force was sampled in 10-revolution intervals and in the remaining 2500 revolutions in 50-revolution intervals.

As shown by FIGS. 6A–6D, the number of CSS cycles to failure is increased by the surface treatment of the present invention. These figures show the coefficient of friction and TDV versus the number of CSS cycles for untreated (FIG. 6A) as well as for treated (FIGS. 6B–6D) recording heads. The results from three different experiments for each surface modification demonstrate similar trends and consistent behaviors, except for the TDV at failure where the corresponding number of CSS cycles exhibits variability. The statistical spread is most likely a result of fluctuations in lubrication coverage and thickness and differences in the disk surface topologies. Failure was assumed to occur as soon as the TDV reached a value equal to or greater than the assumed failure threshold of 6 m/s. Interfacial failure was always accompanied with both high friction coefficients and spontaneous increases in the TDV.

The initial magnitudes of the coefficient of friction and TDV are fairly similar, i.e., about 0.16 and 4.5 m/s, respectively, regardless of the head surface condition. The negligible difference between the initial TDV with modified and unmodified heads indicates that the effect of the surface modification on the original topography was secondary. In the case of unmodified heads, FIG. 6A shows that the coefficient of friction increased rapidly reaching a maximum of about 0.5 after approximately 1750 CSS cycles. At this stage the tests were terminated because the TDV exceeded the threshold value corresponding to failure. Thus for the adopted testing conditions, the number of CSS cycles to failure for unmodified heads is predicted to be less than 2000.

FIG. 6B shows that silver-modified heads exhibited a life to failure higher by a factor of about two. According to the TDV results, the number of CSS cycles for wear debris formation and, hence, interfacial failure is larger than 2500. The coefficient of friction again increased at a relatively high rate in the first 500 CSS cycles reaching values in the range of 0.3 to 0.45.

FIG. 6C demonstrates that the number of CSS cycles to failure of carbon-modified heads is larger than 4000. Although the coefficient of friction is similar to that of silver-modified heads, its magnitude increased to $-0.5$ slightly before the commencement of failure due to wear debris accumulation on the head surface.

FIG. 6D shows that despite the relatively low magnitudes of friction coefficients achieved with titanium-modified heads (between 0.3 and 0.4), the rapid increase in the TDV indicates that interfacial damage occurred in less than 2000 CSS cycles, as for unmodified heads.

In view of the results presented in FIGS. 6A–6D, it may be concluded that, under the CSS testing conditions, the best tribological characteristics were obtained with carbon-modified heads. The transfer of wear debris on the rails of all heads at the stage of failure was confirmed with optical microscopy.

Results revealing the evolution of the coefficient of friction with the number of sliding revolutions are presented in FIGS. 7A–7D for both unmodified and modified heads rubbed continuously against unlubricated carbon-coated rigid disk. FIG. 7A shows that the coefficient of friction of unmodified heads increased from an initial value of 0.2 to a markedly higher value of about 1.3 in approximately 1000 revolutions. After this stage, the coefficient of friction exhibited fluctuations which, although on a first sight may appear to indicate erratic friction behavior, they can be associated with variations in the real contact area due to the agglomeration of wear debris. Microscopy studies showed that a significant decrease in the friction coefficient was always an indication of smearing of wear debris adhering on the head rails.

FIGS. 7B–7D show that significantly better friction characteristics were obtained with modified ceramic recording heads. Although the initial friction coefficients were in the range of 0.2 to 0.3, i.e., slightly higher than those of unmodified heads, the variability in friction during sliding is remarkably small. The best friction behavior was obtained with silver-modified heads. As shown by FIG. 7B, the friction coefficient deceased rapidly for silver-modified heads in the first 200 revolutions reaching a steady-state value between 0.1 and 0.2. FIGS. 7C and 7D show that in the case of carbon- and titanium-modified heads, respectively, the friction coefficient increased very slowly with the number of revolutions reaching values in the range of 0.1 to 0.45. Optical microscopy studies showed that the amount of wear debris obtained with modified heads was much less than that for unmodified heads. The lowest wear rates of the disk surfaces resulted from sliding against silver-modified heads.

In summary, a cost-effective method for obtaining very smooth, low friction, and durable surfaces of magnetic recording heads has been described.

The present invention has been described in terms of a preferred embodiment. The invention, however, is not limited to the embodiment depicted and described. Rather, the scope of the invention is defined by the appended claims.

What is claimed:

1. A process for producing an article with improved ceramic surface properties, comprising the steps of:

providing an article having a ceramic surface;

placing said article onto a conductive substrate holder in a hermetic enclosure;

providing a low pressure ambient in said hermetic enclosure;

producing, by means other than a vacuum arc plasma gun, a plasma comprising ions of solid materials, said ceramic surface of said article being at least partially immersed in a macroparticle free region of said plasma; and while said article is immersed in said macroparticle free region, varying a bias of said substrate holder between a low voltage at which material from said plasma condenses on the surface of said article and a high negative voltage at which ions from said plasma are implanted into said article.

2. The process of claim 1 wherein said high negative voltage of said substrate holder is between about −20V to −100 kV, a total dose of ions impinging on said article is between about $10^{14}$ to $10^{18}$ cm$^{-2}$, said plasma has a density at the surface of said article between about $10^6$ to $10^{13}$ cm$^{-3}$, and said bias of said substrate holder is pulsed with a duty cycle of at least about 1%.

3. The process of claim 2 wherein said high negative voltage of said substrate holder is between about −100V to −10 kV, said total dose of ions impinging on said article is between about $10^{15}$ to $10^{17}$ cm$^{-2}$, said plasma has a density at the surface of said article between about $10^8$ to $10^{11}$ cm$^{-3}$, said bias of said substrate holder is pulsed with a duty cycle of about 10 to 50%, and said plasma comprises ions from the group consisting of silver, carbon, titanium, gold, platinum, copper, tungsten, tantalum, molybdenum, aluminum, hafnium, and silicon.

4. The process of claim 3 wherein said high negative voltage of said substrate holder is about −2 kV.

5. The process of claim 3 wherein said total dose of ions impinging on said article is about $3 \times 10^{16}$ cm$^{-2}$.

6. The process of claim 3 wherein said plasma has a density at the surface of said article of about $6 \times 10^{10}$ cm$^{-3}$.

7. The process of claim 2 wherein said low pressure ambient includes a reactive gas.

8. The process of claim 7 wherein said plasma has a density at the surface of said article of about $6 \times 10^{10}$ cm$^{-3}$.

9. The process of claim 7 wherein said bias of said substrate holder is pulsed with a duty cycle of about 30%.

10. The process of claim 1 wherein said low pressure ambient includes a reactive gas.

11. The process of claim 10 wherein said bias of said substrate holder is pulsed with a duty cycle of about 30%.

12. The process of claim 10 wherein said bias of said substrate holder is pulsed with a duty cycle of about 30%, said high negative voltage of said substrate holder is about −2 kV, said total dose of ions impinging on said article is about $3 \times 10^{16}$ cm$^{-2}$, and said plasma has a density at the surface of said article of about $6 \times 10^{10}$ cm$^{-3}$.

* * * * *